(12) United States Patent
Alley

(10) Patent No.: US 9,057,743 B2
(45) Date of Patent: Jun. 16, 2015

(54) APPARATUS AND METHOD FOR WETTING CURRENT MEASUREMENT AND CONTROL

(71) Applicant: GE Intelligent Platforms, Inc., Charlottesville, VA (US)

(72) Inventor: Daniel Alley, Earlysville, VA (US)

(73) Assignee: GE INTELLIGENT PLATFORMS, INC., Charlottesville, VA (US)

( * ) Notice: Subject to any disclaimer, the term of this patent is extended or adjusted under 35 U.S.C. 154(b) by 140 days.

(21) Appl. No.: 13/864,393

(22) Filed: Apr. 17, 2013

(65) Prior Publication Data

US 2014/0312871 A1    Oct. 23, 2014

(51) Int. Cl.
*G05F 1/00*    (2006.01)
*G01R 19/00*    (2006.01)

(52) U.S. Cl.
CPC ...................................... *G01R 19/00* (2013.01)

(58) Field of Classification Search
CPC ............ G05F 1/67; H02M 1/00; H02M 3/156
USPC ......................................... 363/283, 299, 304
See application file for complete search history.

(56) References Cited

U.S. PATENT DOCUMENTS

| 4,532,466 | A | 7/1985 | Polinski, Jr. |
| 6,584,197 | B1* | 6/2003 | Boudreaux et al. ...... 379/413.02 |
| 7,023,187 | B2* | 4/2006 | Shearon et al. ............... 323/266 |
| 2005/0156583 | A1 | 7/2005 | Nachamiev et al. |
| 2009/0085659 | A1* | 4/2009 | Sorace et al. ................. 330/251 |
| 2012/0044015 | A1 | 2/2012 | Magu |
| 2012/0075895 | A1 | 3/2012 | Kletti et al. |

* cited by examiner

*Primary Examiner* — Emily P Pham
(74) *Attorney, Agent, or Firm* — GE Global Patent Operation; Mark A. Conklin

(57) ABSTRACT

A voltage signal and a wetting current are received from a switching device. A first pulse train is created from the voltage signal and the first pulse train has a first duty cycle that is proportional to the voltage at the switching device. The first pulse train is transmitted across an isolation barrier. The first pulse train that is received across the isolation barrier is digitized and at least one operating condition of the switching device is determined based upon the digitized pulse train. A second pulse train having a second duty cycle is received and the wetting current from the switching device is controlled based upon the second duty cycle.

19 Claims, 9 Drawing Sheets

APPARATUS AND METHOD FOR WETTING CURRENT MEASUREMENT AND CONTROL

CROSS REFERENCES TO RELATED APPLICATIONS

Utility application entitled "Programmable Contact Input Apparatus and Method of Operating the Same" naming as inventor Daniel Alley;

Utility application entitled "Contact Input Apparatus Supporting Multiple Voltage Spans and Method of Operating the Same" naming as inventor Daniel Alley;

are being filed on the same date as the present application, the contents of which are incorporated herein by reference in their entireties.

BACKGROUND OF THE INVENTION

1. Field of the Invention

The subject matter disclosed herein relates generally to sensing information associated with switching devices and, more specifically, to sensing a wide range of types and values of this information.

2. Brief Description of the Related Art

Different types of switching devices (e.g., electrical contacts, switches, and so forth) are used in various environments. For example, a power generation plant uses a large number of electrical contacts (e.g., switches and relays). The electrical contacts in a power generation plant can be used to control a wide variety of equipment such as motors, pumps, solenoids and lights. A control system needs to monitor the electrical contacts within the power plant to determine their status in order to ensure that certain functions associated with the process are being performed. In particular, the control system determines whether the electrical contacts are on or off, or whether there is a fault near the contacts such as open field wires or shorted field wires that affect the ability of the contacts to perform their intended function.

One approach that a control system uses to monitor the status of the electrical contacts is to send an electrical voltage (e.g., a direct current voltage (DC) or an alternating current (AC) voltage) to the contacts in the field and determine whether this voltage can be detected. The voltage, which is provided to the electrical contacts for detection, is known as a wetting voltage. If the wetting voltage levels are high, galvanic isolation in the circuits is used as a safety measure while detecting the existence of voltage. Detecting the voltage is an indication that the electrical contact is on or off. A wetting current is associated with the wetting voltage and received by the monitor.

Various problems have existed with previous approaches in monitoring contacts and other types of switching devices. For example, the contacts need to be isolated from the control system, or damage to the control system may occur. Also, the control system may need to handle a wide variety of different voltages, but previous devices could only handle voltages within narrow ranges. Previous devices have also been inflexible in the sense that they cannot be easily changed or modified without circuit changes involving setting jumpers and/or adjusting resistors or other components to account for changes in the operating environment or conditions, or received voltages. All of these problems have resulted in general dissatisfaction with previous approaches due to the need to supply many variations of the same circuit function with each set to a particular voltage and/or current.

BRIEF DESCRIPTION OF THE INVENTION

The approaches described herein provide discrete contact input circuits that operate over a wide range of input spans (e.g., approximately 12 volts to approximately 500 volts in one example). Galvanic isolation is also provided between the contact input circuit and a system controller. In some aspects, the output of the contact input circuit is a continuous pulse train that, when analyzed (e.g., by a control system), allows for the detection of channel faults (e.g., if the output goes high or low continuously, a circuit fault exists). The duty cycle of the pulse train may be used to estimate the amount of voltage, allowing for open wire detection circuits. Moreover, optocouplers or other forms of galvanic isolation can also be used to drive a pulse train back from the system controller to the contact input circuit to set up the amount of desired wetting current. This allows external logic to the contact input circuit to determine the amount of voltage and then adjust the wetting current to limit power dissipation. The circuitry described herein can also be inserted within an analog application specific integrated circuit (ASIC) or any other type of integrated circuit.

In many of these embodiments, a voltage signal providing a wetting current is received from a switching device. A first pulse train is created from the voltage signal and the first pulse train has a first duty cycle that is proportional to the voltage at the switching device. The first pulse train is transmitted across an isolation barrier. The first pulse train that is received across the isolation barrier is digitized and at least one operating condition of the switching device is determined based upon the digitized pulse train. A second pulse train having a second duty cycle is received and the wetting current from the switching device is controlled based upon the second duty cycle.

In some aspects, the second pulse train is received from a first optocoupler and the second pulse train is generated by a software controller (e.g., at a control system). In other examples, the transmitting of the first pulse train is accomplished using a second optocoupler.

In some other aspects, the second pulse train is filtered. In yet other aspects, the first pulse train is filtered to extract an analog signal representing the first duty cycle. In other examples, the first pulse train is created regardless of a value of the voltage signal.

In others of these embodiments, an apparatus that is configured to create an electrical signal includes an input voltage sensing circuit, a communications isolation circuit, and a current sink circuit. The input voltage sensing circuit is configured to receive a voltage signal and a wetting current from a switching device and responsively create a first pulse train from the voltage signal. The first pulse train has a first duty cycle that is proportional to the voltage at the switching device. The communications isolation circuit is coupled to the input voltage sensing circuit and is configured to transmit the first pulse train across an isolation barrier. The communications isolation circuit is configured to digitize the first pulse train that is received across the isolation barrier. The operating conditions of the switch are determinable based upon the digitized pulse train. The current sink circuit is coupled to switching device and the input sensing circuit. The current sink circuit is configured to receive a second pulse train that has a second duty cycle and control the wetting current based upon the second duty cycle.

In some aspects, the second pulse train is received from a first optocoupler and the second pulse train is generated by a software controller. In other aspects, the transmission circuit comprises a second optocoupler.

The operating condition may be a wide variety of conditions such as a circuitry failure, a power supply failure, a detection of an open wire, or an optocoupler failure. Other examples are possible.

The apparatus may also include a first filter that is configured to filter the second pulse train. The apparatus may also include a second filter that is configured to filter the first pulse train to extract an analog signal representing the first duty cycle.

In some examples, the first pulse train is created from the voltage signal regardless of a value of the voltage signal. In other examples, the apparatus is disposed on an integrated circuit (e.g., an application specific integrated circuit (ASIC)).

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE INVENTION

The approaches described herein provide a discrete input channel that detects a wide input voltage spans and contact closures via analysis of a duty cycle of a pulse train. The circuit provides reduced cost designs including the reduced costs associated with the digital isolation barrier. In some aspects, the circuit will continuously oscillate, allowing for detection of optocoupler failure, isolated circuitry failures, and isolated supply failure to mention a few examples. The approaches described herein can be used for wetting current control and filtering for analog output voltages should an analog-to-digital (A/D) converter be used for signal measurement.

In other aspects, the present approaches allow for a fixed circuit design that covers a wide operating span for received voltages from switching devices (e.g., a 12 to 500 volt input span). As mentioned, wetting current control is also provided, where, in one example, low voltage circuits use several mA of wetting current, while higher voltage circuits derate the current to maintain under several hundred milliwatts of heat generation. Analog signal conversion allows for either digital processing from the duty cycle or analog processing (e.g. analog microcontroller could sense via A/D and drive out pulse train for wetting control).

Figure 1:
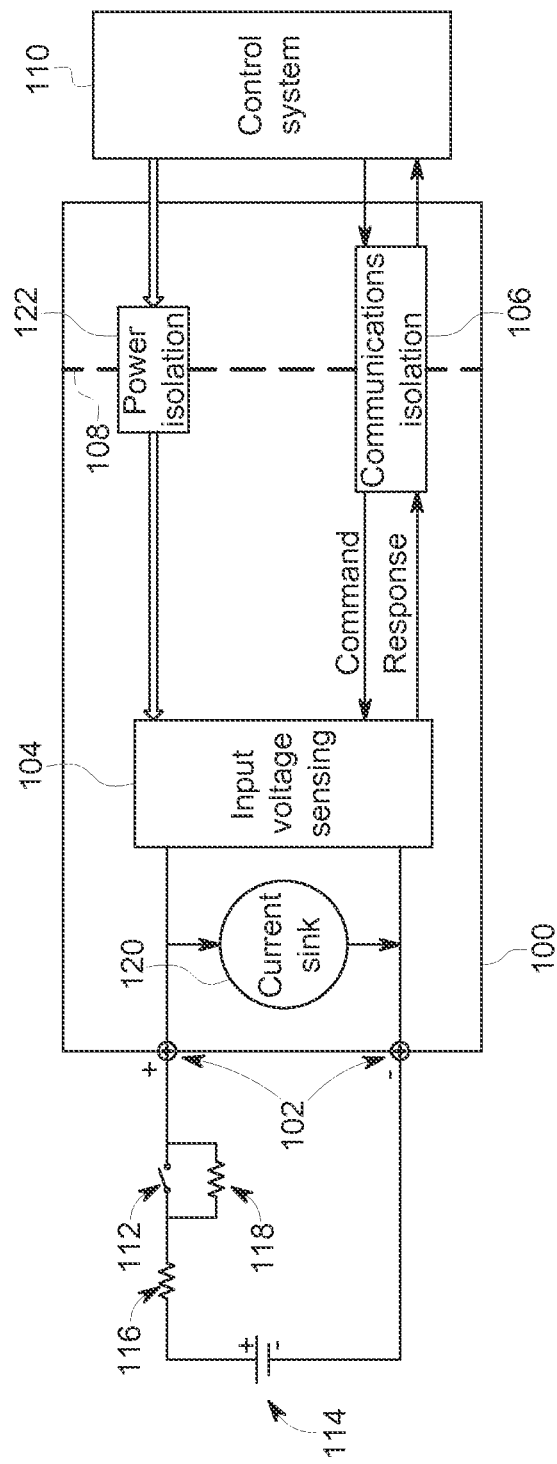
FIG. 1 comprises a block diagram of an example contact input circuit according to various embodiments of the present invention.

Referring now to FIG. 1, one example of a contact input circuit 100 is described. The contact input circuit 100 includes one or more inputs 102, comprising positive and negative input terminals (IN+ and IN−) in this example, an input voltage sensing module 104, as well as a communications isolation circuit 106. The contact input circuit 100 is configured such that it provides information about a signal existing on the inputs 102 across an isolation barrier 108 to a control system 110 for processing thereof. The input voltage sensing module 104 may convert sensed inputs into a pulse train. A current sink circuit 120 may control the wetting current that is received by the contact input circuit 100.

The isolation barrier 108 may represent a simple lack of coupling such that the two sides of the isolation barrier (i.e., the side of the inputs 102 and the side of the control system 110) are electrically insulated or isolated from one another to provide galvanic isolation. The isolation barrier 108 provides protection for the control system 110 from electrical characteristics and abnormalities existing on the input 102 side of the isolation barrier that the control system 110 may simply be incapable of withstanding. For example, the control system may be configured to operate with 3.3V, 5V, 12V, or 24V power supply and utilize corresponding small signals. However, to take one example, the input 102 side of the isolation barrier may be a higher-voltage circuit with operating voltages exceeding 250V, or even 500V. Further, and especially in the instance where a switching device 112 is used in power plant applications or are otherwise geographically spread apart, lighting or other phenomena may create sizeable surges on the inputs 102 exceeding hundreds or thousands of volts, which surges a control system 110 may not be capable of withstanding. The control system 110 may also include any combination of processing devices that execute programmed computer software and that are capable of analyzing information received from the contact input circuit 100.

So configured, and in one example setting, the contact input circuit 100 can be utilized with the switching device 112 (e.g., an electro-mechanical switch, contacts, or other switching means) such that the information provided about the signal existing at the inputs 102 can be utilized to determine various aspects or characteristics of the switching device (e.g., if it is closed, open, shorted, subject to a weak connection, oxidized, and so forth). In such an example setting, the switching device 112 may be coupled to a power supply 114 or other power source. Various resistances associated with the switching device 112, the power supply 114, or current paths are represented generally by series resistor Rs 116 and parallel resistor Rp 118. Resistors 116 and 118 allow for detection of wiring faults, where the open switch voltage and the closed switch voltage are different from an open wire input or a short to the supply. Although only a switching device 112 application is described here, the contact input circuit 100 can be utilized in many various application settings to provide information about signals existing at the inputs 102 to the contact input circuit 100.

By at least one approach, the contact input circuit 100 is further equipped with the current sink circuit 120. By this, the contact input circuit 100 may be configured to provide, for example, a wetting current across the switching device 112. Adjustment of the wetting current can be advantageously used to prevent and/or break through surface film resistance in the switching device 112, such as a layer of oxidation, which can otherwise cause the switching device 112 to remain electrically open even when it may be mechanically closed. Further applications include providing a sealing current or fritt current as may be utilized in telecommunications.

By at least another approach, the communications isolation circuit 106 can provide communications from the control system 110 to the contact input circuit 100. For example, these communications may be commands to control the current sink 120 according to various requirements and/or sensed aspects of the input signal. Lastly, in another approach, the contact input circuit 100 may include a power isolation circuit 122 that is configured to provide power to the contact input circuit 100 through power transfer across the isolation barrier 108 (e.g., through the use of a transformer or by other known power transfer techniques).

Figure 2:
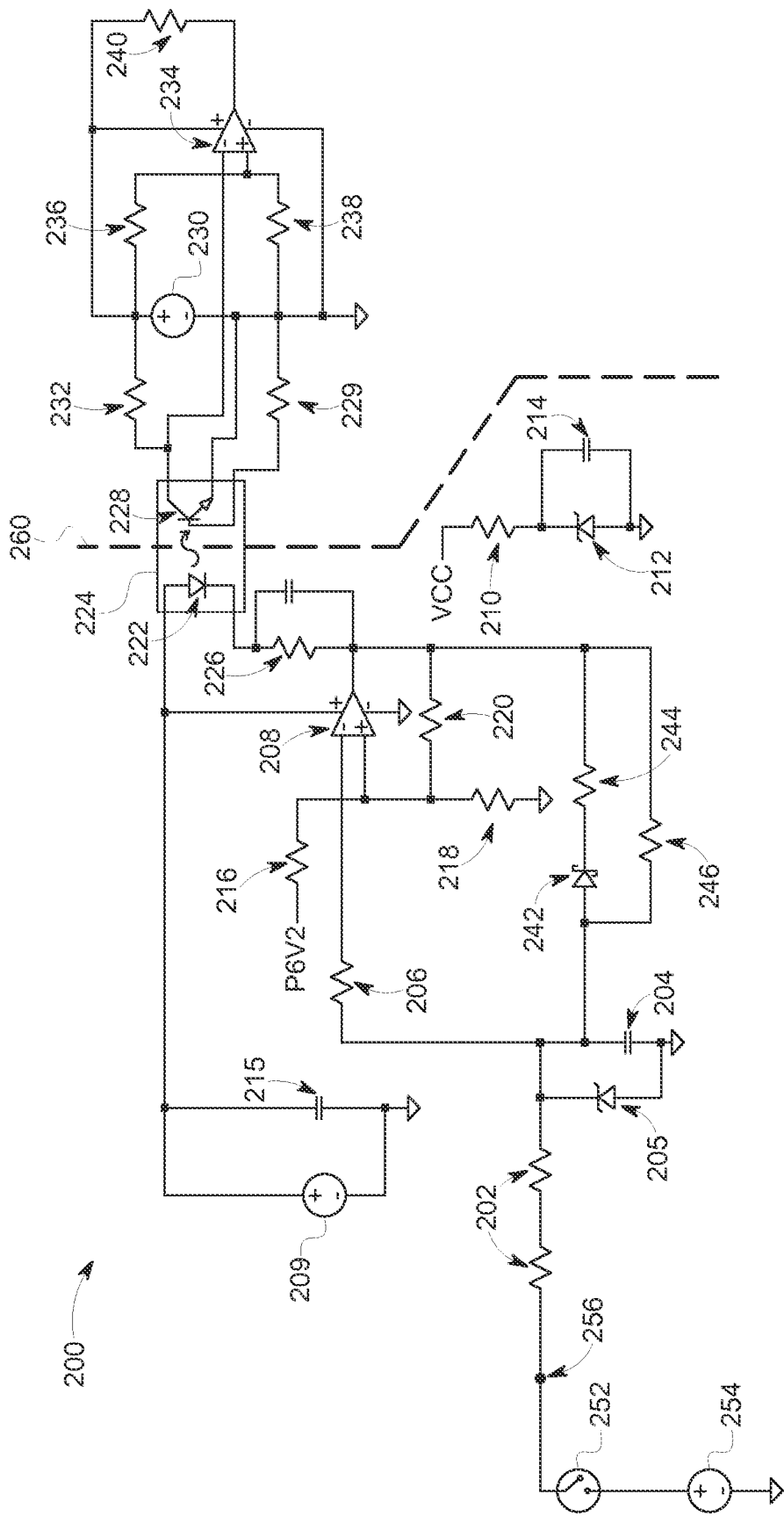
FIG. 2 comprises a circuit diagram illustrating further details of a portion of the circuit illustrated in FIG. 1 according to various embodiments of the present invention.

Turning now to FIG. 2, a circuit diagram is provided illustrating further details of a contact input circuit 200 (e.g., the contact input circuit 100 shown in FIG. 1) in accordance with at least one approach. FIG. 2 shows details of a voltage sensing module (e.g., the input voltage sensing module 104 of FIG. 1), in particular the creation of a train of voltage pulses. A switching device 252 is shown coupled to a power supply 254. At least one side of the switching device 252 is coupled to at least one input 256 of the contact input circuit 200, preferably the input IN+, with the input IN− being coupled to a local ground that is isolated from the controller in this example. The contact input circuit 200 includes one or more input resistors 202 configured to reduce the current coming in to the contact input circuit 200. The reduced input current is then fed from the input resistors 202 into a charging capacitor 204 with the other end of the charging capacitor 204 coupled to ground (or IN−). A zener diode 205 is optionally placed across the reduced input current signal and ground to protect the contact input circuit 200 from over-voltage conditions such as lighting strikes, and so forth. As the current enters the charging capacitor 204, a charge (i.e., voltage) builds on the capacitor 204.

The charge on charging capacitor 204 is coupled through an input resistor 206 and fed into an inverting input of a first comparator 208. The first comparator 208 receives a threshold voltage on its non-inverting input. The threshold voltage is generated from a local power supply VCC 209 (which may be received or sourced from a control system (not shown in FIG. 2) or by other means) that is fed through a resistor 210 in series with a precision zener diode 212 to create a reference voltage commensurate with the value of the precision zener diode 212 (in this instance, the zener diode 212 set to provide a reference voltage of 6.2V). The precision zener diode 212 may be in parallel with a filtering capacitor 214 to filter the reference voltage. Additional filtering capacitor 215 may be provided. The reference voltage is then fed through a voltage divider consisting of two resistors 216 and 218 that are configured to divide the reference voltage to generate the base threshold voltage. Hysteresis resistor 220 is provided across the non-inverting node and the output node of the first comparator 208 to slightly shift the threshold voltage (i.e., create hysteresis) to prevent or reduce chatter or jitter on the output of the first comparator 208 as the charge from the charging capacitor 204 moves above and below the threshold voltage as will be described below. For example, as configured in FIG. 2, the threshold voltage will be slightly lower when the output of the first comparator 208 is low, and the threshold voltage will be slightly higher when the output of the first comparator 208 is high.

Assuming the charging capacitor 204 is in a charging mode (i.e., the voltage across it is rising), the voltage on the inverting input to the first comparator 208 will eventually rise above the threshold voltage. When this happens, the output of the first comparator 208 will go from high to low resistance to ground (e.g., from resistance in mega ohms to approximately 0 ohms) by effectively coupling the output of the first comparator 208 to ground. As this happens, the hysteresis resistor 220 is then coupled to ground, which has the effect of lowering the threshold voltage slightly, resulting in hysteresis on the threshold voltage.

An isolation barrier 260 is shown. With the output of the first comparator 208 at a low state, current will begin to flow from VCC through the light emitting diode (LED) 222 of optocoupler 224 through pull-down resistor 226 to the low output of the first comparator 208. The optocoupler 224 bridges the isolation barrier 108 and allows the light from the LED 222 to traverse the isolation barrier to a light sensing transistor 228 within the optocoupler 224, thus communicating the signal without a galvanic electric connection. As the light sensing transistor 228 is activated, current will flow through its base and a base resistor 229. The light sensing transistor 228 will then draw current from a low-voltage power supply 230 (in this example set to 3.3V) through pull-up resistor 232, which will produce a low signal on the collector output of the light sensing transistor 228 of the optocoupler 224. The collector output is coupled to an inverting input of a second comparator 234. The non-inverting input of the second comparator 234 receives a second threshold voltage, which is produced by another voltage divider circuit consisting of resistors 236 and 238. With the collector output of the optocoupler 224 set to low, the second comparator 234 will then produce a high output signal (i.e., approximately 3.3V), which is pulled high by pull-up resistor 240. In other applications, the optocoupler 224 may be replaced with a device providing a direct logic output. This would replace the second comparator 234 and the associated resistors that were used to convert the output voltage of the transistor 228 to match logic levels.

Returning to the output of the first comparator 208, while it remains in a low state, the charge from the charging capacitor 204 will then dissipate across diode 242 (preferably a Schottky diode) and resistor 244 to the low output of the first comparator 208. As this occurs, the voltage of the charging capacitor 204, which is fed to the inverting input of the first comparator 208, will eventually fall below the threshold voltage established by resistors 206, 218, and 220, with resistor 220 providing the above described hysteresis effect. When the voltage across by the charging capacitor 204 does fall below the voltage threshold, the output of the first comparator 208 will go from a low output (i.e., ground) to high (i.e., very close to VCC).

With the output of the first comparator 208 being high, current will cease to flow through the LED 222 of the optocoupler 224, which will resultantly turn off the light sensing transistor 228 of the optocoupler 224, thus preventing current from flowing through pull-up resistor 232 and creating a high level voltage (i.e., 3.3V in this example) into the inverting input of the second comparator 234. As this high level input is higher than the threshold voltage established by the resistor divider network of resistors 236 and 238, the output of the comparator will then go from its previous high output signal to a low output signal (i.e., tied to ground of the control system).

At this point, the process repeats itself, with the current entering the contact input circuit 200 through input resistors 202 and across resistor 246 being used to charge the charging capacitor 204 once again until its voltage exceeds the threshold voltage at the non-inverting input to the first comparator 208.

As this process repeats, a pulse train is created which is eventually output to the control system at the output of the second comparator 234. The pulse train will vary its duty cycle based on the voltage existing at the input to the contact input circuit 200 across the switching device 252. The higher the voltage across the switching device 252, the higher the current flow that enters into the circuit via the input resistors 202. With a higher current, the charging capacitor 204 charges up quicker, which results in the voltage at the charging capacitor 204 being below the threshold voltage (existing at the non-inverting input to first comparator 208 and set by resistors 216, 218, 220) for a shorter time, creating a higher duty cycle. Accordingly, a higher input voltage results in a higher duty cycle.

The rate at which the charging capacitor 204 is charged and discharged is set by, at least in part, the values of input resistors 202, discharge resistor 244, and resistor 246. These values, combined with the capacitance value of the charging capacitor 204, will greatly influence the operating frequency of the pulse train as well as the duty cycle thereof across a wide variety of voltage inputs (for example, from about −30V to +500V). In one aspect, the contact input circuit 200 is capable of operating even with a negative voltage input because resistor 246 allows current to charge the charging capacitor 204 even when current is flowing out of input resistors 202 rather than in (due to the negative potential).

Figure 3:
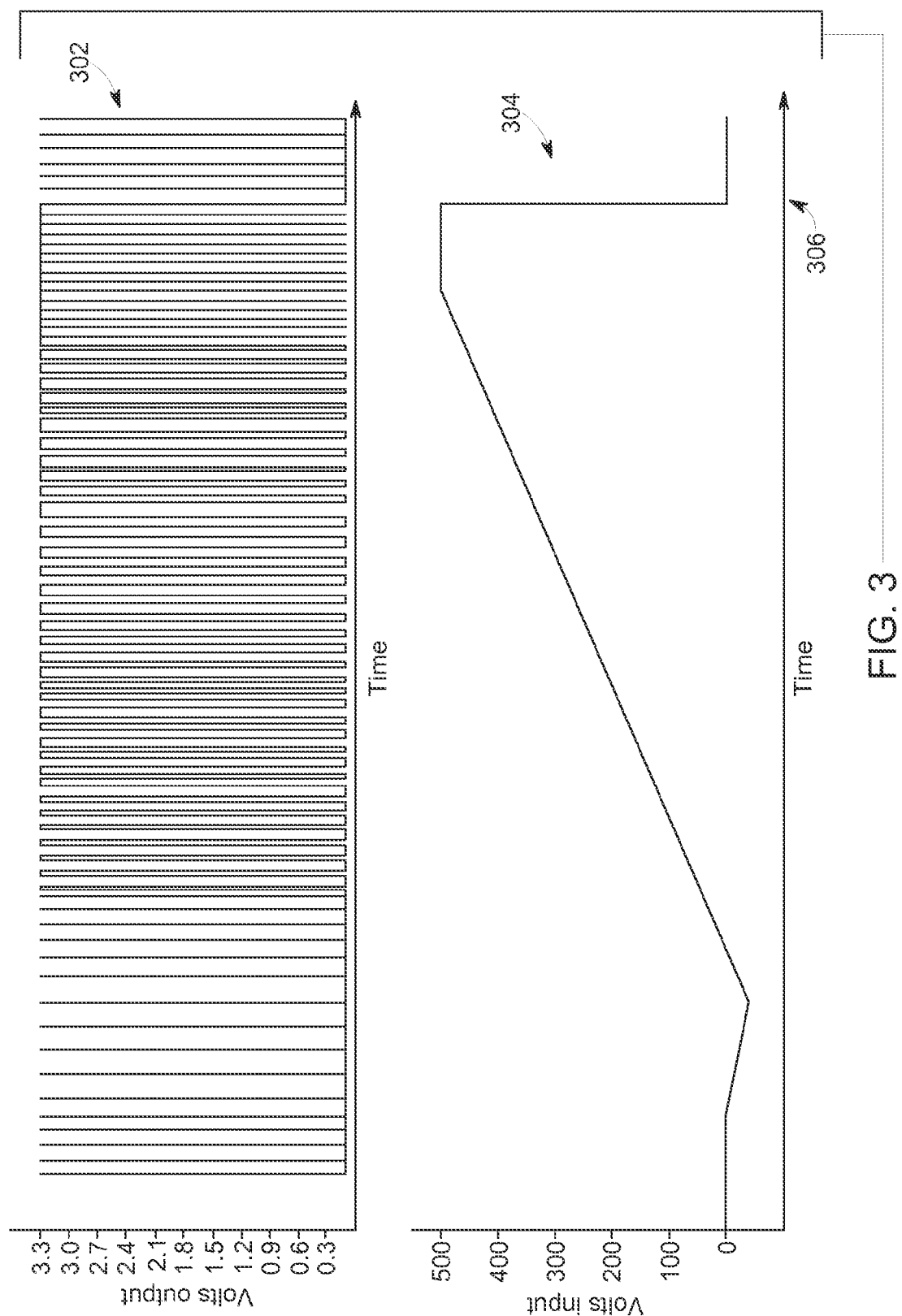
FIG. 3 comprises a diagram of an output signal according to various embodiments of the present invention.
Figure 4:
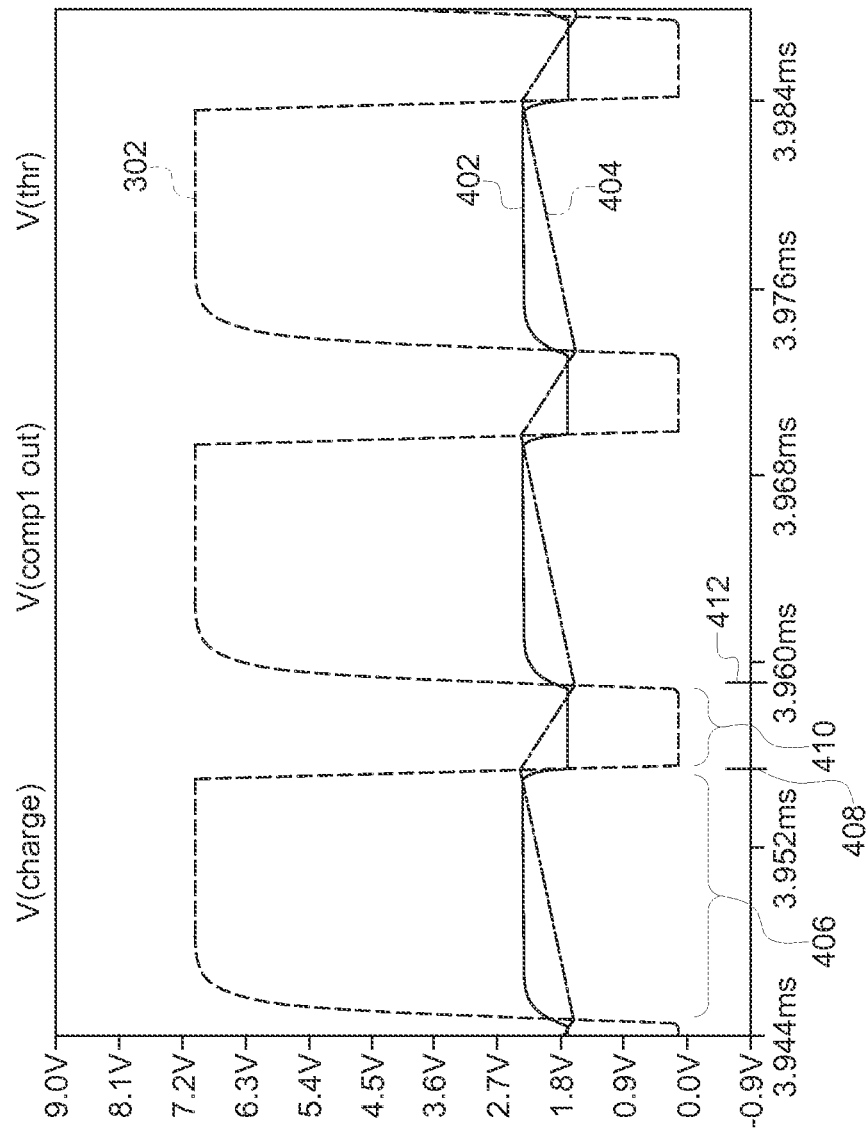
FIG. 4 comprises a portion of the output signal of FIG. 3 according to various embodiments of the present invention.
Figure 5:
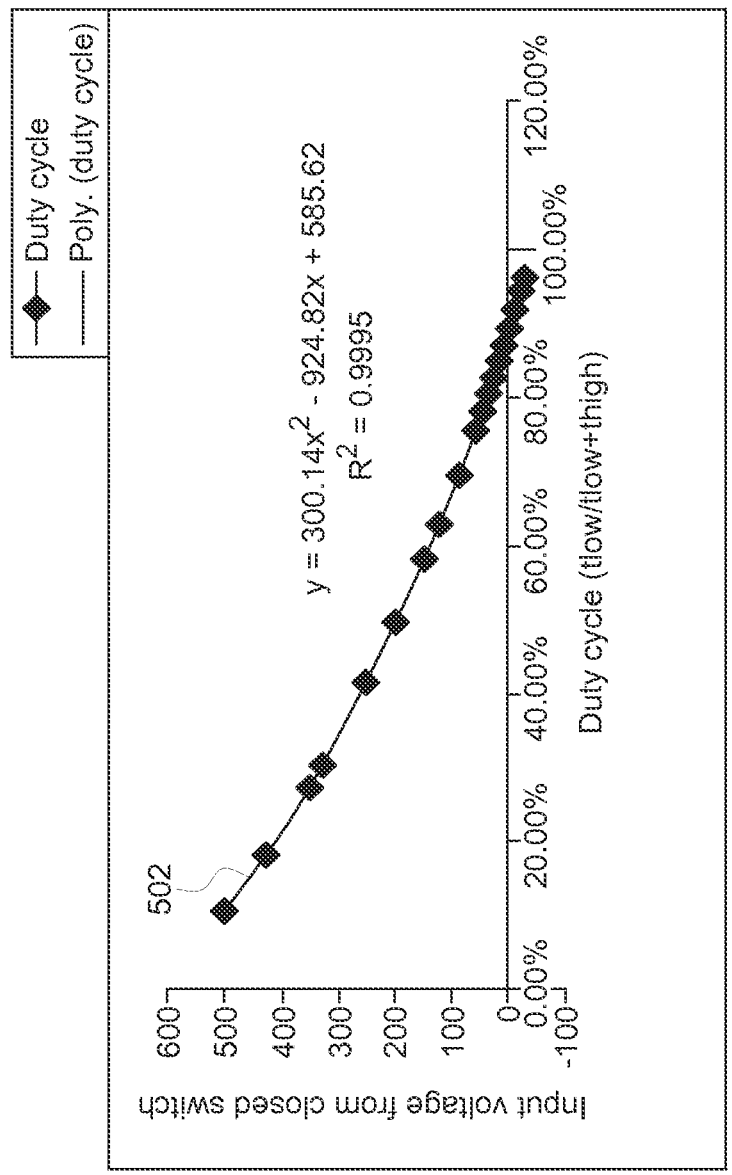
FIG. 5 comprises a plot of an inverse duty cycle of an output pulse train according to various embodiments of the present invention.

Referring now to FIGS. 3-5, various performance aspects are illustrated in accordance with various approaches. FIG. 3 illustrates an example pulse train output 302 as may exist on the output of a comparator (e.g., the second comparator 234 of FIG. 2) across a wide variety of input voltages. These diagrams correspond, for example, to the circuits of FIG. 1 and FIG. 2 with corresponding reference to elements of these two figures.

As shown, the x-axis represents time while the y-axis represents voltage. A voltage sweep of the input voltage 304 (also referred to as input voltage 304) is illustrated representing a hypothetical sweep voltages existing across the switching device 112 or 252 and at the input to the contact input circuit 100 or 200. The sweep of the input voltage 304 starts at approximately 0V, goes negative to approximately −30 volts, and then continues linearly up to 500V, where it maintains 500V until such time as the switching device 112 or 252 is opened at time 306. The sweep of the input voltage 304 itself is an unlikely condition that will exist across the switching device 112 or 252 during normal. Typically, a constant voltage (e.g., 24V, 48V, 250V, etc) will exist across the switching device 112 or 252 to supply power to a system or component. However, a sweep of the input voltage 304 is used here to illustrate the variable voltage input feature of the present disclosure and a corresponding varying duty cycle on the pulse train output 302.

As can be seen in FIG. 3, as a contact input circuit (e.g., the contact input circuit 200) starts up (i.e., at time 0), the pulse train output 302 will remain high until the charging capacitor 204 builds some charge from the incoming current across input resistors 202 and resistor 246 that exceeds the threshold voltage. Once the charge builds, the pulse train will begin oscillating. Initially, as the input voltage is at 0, the duty cycle of the pulse train output 302 is low (approximately between 10-15% by one approach). As the sweep of the input voltage 304 goes negative, the duty cycle further lowers (e.g., to as low as nearly 4% at −30V by one approach). However, as the voltage begins again to increase all the way to +500V, the duty cycle will increase as well. In one example, the duty cycle may be nearly as high as 90% at 500V. At time 306, the switching device 112 or 252 is opened, and 0V is seen at the sweep 304, which results in a pulse train output 302 that is nearly identical to the pulse train at the beginning, both of which correspond to a 0V input signal (sweep 304).

Turning now to FIG. 4, a zoomed view 400 of a portion of the pulse train output 302 of FIG. 3 is illustrated. The zoomed view 400 includes the pulse train output 302 as well as a threshold voltage 402 corresponding to the threshold voltage at the non-inverting input to the first comparator 208, and a voltage signal 404 corresponding to the voltage on charging capacitor 204. The threshold voltage 402 oscillates with the pulse train output 302 due to the hysteresis effect introduced by hysteresis resistor 220, discussed above. As is shown here, while the pulse train output 302 is high, the threshold voltage 402 is also slightly higher. During time segment 406, as the voltage at the charging capacitor 204 steadily increases (as fed charged by current from input resistors 202 and resistor 246), it will eventually surpass the threshold voltage 404 at point 408. At that point 408, the output of the first comparator 208 will switch, causing the pulse train output 302 to go from high to low, which then lowers the threshold voltage 402 due to the hysteresis resistor 220. The charging capacitor 204 will begin to discharge through diode 242 and resistors 244, as shown by the downward sloping portion of signal 404 during segment 410, until it becomes lower than the lowered threshold voltage 402 at point 412. At this point 412, the first comparator 208 will switch again (from low to high) and the pulse train output 302 will go from low to high, and the process repeats itself, resulting in the pulse train output 302.

Referring next to Table 1, an example table of values corresponding to at least one approach is shown. The table lists the state of the input switching device 112 (or 252) on the left with an "open" or "closed," the input voltage ranging from +500V to −30V (as may correspond to the input voltage sweep 304 in FIG. 3), a time the output signal is low, and a time the output signal is high. Table 1 also shows the approximate output frequency of the optocoupler 224, which corresponds to the frequency of the pulse train. An inverse of the duty cycle is provided representing the portion of a single cyclical pulse that is low as compared to the total pulse period duration (represented by the equation $T_{LOW}/(T_{LOW}+T_{HIGH})$). In one approach, the pulse train output 302 is received by a processing device and is digitized. Representative digitized values of the low time (i.e., $T_{LOW}$) and the total pulse period (i.e., $T_{LOW}+T_{HIGH}$) are provided as may be counted by a processing device in one approach. Finally, a digitized inverse duty cycle is calculated.

FIG. 5 illustrates the inverse duty cycle 502 of the pulse train output 302 as compared to various input voltages. The values illustrated here correspond to the values as exist in Table 1, which values correspond to at least one approach. As is shown here, the inverse duty cycle increases as the input voltage 304 lowers (which corresponds to a increasing non-inverted duty cycle as the input voltage 304 increases). The resulting duty cycle line 502 is nearly linear (close enough to linear to allow decision thresholds on voltage thresholds to be uniformly spread apart) by at least on approach. Here, the resulting line may be a polynomial line having the equation illustrated in FIG. 5.

In one approach, a processing device can utilize the calculated duty cycle (i.e., digitized inverse duty cycle of Table 1) to determine the voltage present at the input at that moment. This may occur via a lookup table, a simple conversion calculation, or other known methods. For example, the processing device may look compare the calculated duty cycle to a table having values for various calculated duty cycles, much like Table 1, and can determine the corresponding input voltage value associated with that calculated duty cycle. By another approach, a processing device may be configured such that it is aware of the formula, or an approximation of the formula, representative of the duty cycle line 502 (e.g., the formula shown in FIG. 5) so that the processing device may calculate the corresponding input voltage. Other methods of relating a calculated duty cycle to a voltage are contemplated here and are within the scope of this disclosure.

The current sink circuit 600 may be introduced into or added to the contact input circuit 100 or 200 to control a wetting current. Starting at the right side of the current sink circuit 600, a current source 602 is provided and is modulated by the control system (e.g., the control system 110 in FIG. 1). The control system can create a wetting current pulse train (different from the pulse train discussed above) that it implements on the current source 602. The current source 602 intermittently provides current to the optocoupler 604 according to the wetting current pulse train. The optocoupler 604, which bridges the isolation barrier 658, may operate much as the optocoupler 224 described above, only in a reverse direction, taking inputs from the control system (e.g., the control system 110) and providing an output to the contact input circuit 100 or 200. Other suitable isolation bridging circuits or components may be utilized instead. When current

TABLE 1

Duty Cycle Data

| Input State | Input Voltage | Time low | Time High | Opto Output Frequency | Duty cycle | Digitized High | Digitized Period | Dig. Duty Cycle |
|---|---|---|---|---|---|---|---|---|
| Closed | 500 | 1.48E−06 | 1.24E−05 | 71940.89 | 10.61% | 37 | 348 | 10.63% |
| Closed | 425 | 2.11E−06 | 9.56E−06 | 85648.63 | 18.09% | 53 | 292 | 18.15% |
| Closed | 350 | 2.99E−06 | 8.00E−06 | 91058.34 | 27.19% | 75 | 275 | 27.27% |
| Closed | 325 | 3.33E−06 | 7.63E−06 | 91212.16 | 30.40% | 84 | 275 | 30.55% |
| Closed | 250 | 4.75E−06 | 6.69E−06 | 87425.04 | 41.49% | 119 | 286 | 41.61% |
| Closed | 200 | 6.14E−06 | 6.22E−06 | 80914.00 | 49.68% | 154 | 309 | 49.84% |
| Closed | 150 | 8.19E−06 | 5.86E−06 | 71180.56 | 58.28% | 205 | 352 | 58.24% |
| Closed | 125 | 9.59E−06 | 5.68E−06 | 65503.76 | 62.79% | 240 | 382 | 62.83% |
| Closed | 90 | 1.26E−05 | 5.48E−06 | 55185.20 | 69.75% | 316 | 454 | 69.60% |
| Closed | 60 | 1.67E−05 | 5.44E−06 | 45106.81 | 75.44% | 419 | 555 | 75.50% |
| Closed | 48 | 1.92E−05 | 5.30E−06 | 40835.43 | 78.35% | 480 | 613 | 78.30% |
| Closed | 36 | 2.22E−05 | 5.24E−06 | 36388.78 | 80.92% | 556 | 688 | 80.81% |
| Closed | 30 | 2.43E−05 | 5.21E−06 | 33936.27 | 82.33% | 607 | 737 | 82.36% |
| Closed | 24 | 2.62E−05 | 5.31E−06 | 31770.86 | 83.12% | 655 | 787 | 83.23% |
| Closed | 18 | 2.89E−05 | 5.11E−06 | 29383.42 | 84.97% | 723 | 851 | 84.96% |
| Closed | 12 | 3.23E−05 | 5.19E−06 | 26697.68 | 86.13% | 807 | 937 | 86.13% |
| Closed | 6 | 3.61E−05 | 5.19E−06 | 24195.42 | 87.44% | 904 | 1034 | 87.43% |
| Closed | 0 | 4.13E−05 | 5.11E−06 | 21550.37 | 88.99% | 1033 | 1161 | 88.98% |
| Closed | −12 | 5.67E−05 | 4.96E−06 | 16203.67 | 91.96% | 1419 | 1543 | 91.96% |
| Closed | −24 | 8.98E−05 | 4.98E−06 | 10552.17 | 94.74% | 2245 | 2370 | 94.73% |
| Closed | −30 | 1.26E−04 | 5.11E−06 | 7609.79 | 96.11% | 3158 | 3266 | 96.10% |
| Open | 0 | 3.93E−05 | 5.08E−06 | 22515.77 | 88.57% | 984 | 1111 | 88.57% |

So configured, the contact input circuit 100 or 200 is capable of measuring the input voltage across a wide variety of voltages, even negative voltages, giving it universal applicability. This is advantageous in that a single design or product can be utilized rather than multiple different kinds of contact input circuits specifically configured to operate with different voltages. This reduces complexity of design, reduces the number of different contact input circuits that must be stored on site for replacement, and eliminates the risk of placing an incompatible contact input circuit across a switch which may result in destruction of the contact input circuit (e.g., if too much voltage) or provision of false data from the incorrect circuit. This is particularly useful in settings such as power plants or other industrial settings such as factories and warehouses, where many different voltages may be present across many different switches.

Figure 6:
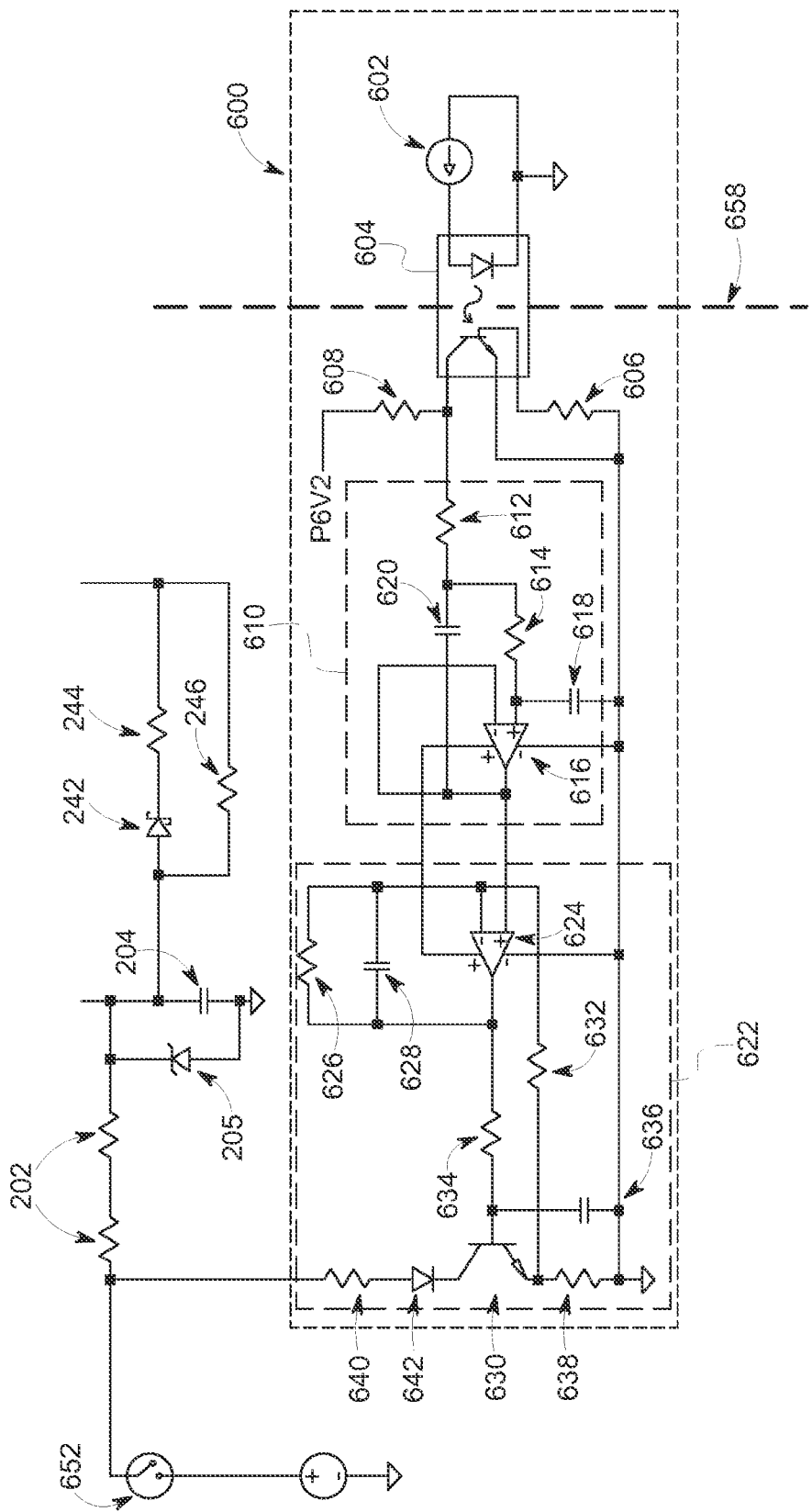
FIG. 6 comprises a current sink circuit according to various embodiments of the present invention.

By certain approaches, a control system (e.g., the control system 110 of FIG. 1) may use the received pulse train signal information to make determinations as to an appropriate wetting current that may flow through the contacts of the switching device 652. Referring now to FIG. 6, a current sink circuit 600 is provided by at least one approach. Elements 662, 662, 662, 664 and 666 correspond to elements 202, 204, 242, 244, and 246 respectively and the description of these elements will not be repeated here.

flows through the LED of the optocoupler 604, current will flow through a base of the light sensing transistor of the optocoupler 604 and a base resistor 606. Resultantly, the light sensing transistor will turn on, which allows current to flow therethrough and also through a pull-up resistor 608, which then creates a low output out of the optocoupler 604. Conversely, when no current flows through the LED of the optocoupler 604, the light sensing transistor shuts off and the pull up resistor 608 pulls the output of the optocoupler 604 high.

In one embodiment, the wetting current pulse train output from the optocoupler 604 is fed into a low pass filter 610. By one approach, the low pass filter 610 receives the wetting current pulse train through an input resistor 612 and a second input resistor 614. This signal is fed to the non-inverting input of an op amp 616 across a filtering capacitor 618 that has its other end tied to ground. The output of the op amp 616 is fed back to the inverting input of the op amp 616 as well as through a capacitor 620 to a node between the first and second input resistors 612 and 614. The output of the low pass filter 610 (being the output of the op amp 616) is a DC signal with a value that corresponds to the value of high versus low pulses in the wetting current pulse train (i.e., the average of the wetting current pulse train).

The low pass filtered signal is then fed into a current regulating circuit 622. The current regulating circuit 622 receives the filtered signal into a non-inverting input of another op amp 624. The output of the op amp 624 is fed back to the inverting input of the op amp 624 across resistor 626 and capacitor 628 in parallel, forming a second low pass filter. The inverting input of op amp 624 is also connected to an emitter of an NPN transistor 630 through a feedback resistor 632. The output of the op amp 624 is fed through resistor 634 to the base of the transistor 630, which is also connected to ground through filter capacitor 636. The emitter of the transistor 630 is coupled to ground through resistor 638 while the collector of transistor 630 is connected to the input of the current sink circuit 600 through resistor 640 and diode 642. In operation, the current regulating circuit 622 attempts to match the voltage across resistor 638 to the voltage coming out of the low pass filter 610 by forcing an appropriate current through transistor 630. Resistors 626 and 632 serve as a gain setting for the current, which can be adjusted as required by a specific design. By this, the current regulating circuit 622 is controlled by the incoming voltage out of the low pass filter 610, and the current sink circuit 600 in its entirety is controlled by a wetting current pulse train from a control system.

So configured, a variable wetting current can be provided across the contacts of the switching device 652 such that power dissipation by the wetting current can be reduced and/or optimized according to the needs of the present conditions or voltage across the switching device 652. For example, if a low voltage exists across the switching device 652 (e.g., 12V or 24V), a higher wetting current may be required to ensure enough power is provided across the switching device 652 contacts to ensure their health. However, if that same higher current were used with a higher voltage, such as 250V or 500V, that higher current would result in a much higher power than is needed across the contacts. This would also result in the need to unnecessarily large components capable of sinking the extra power that would be generated by the higher current combined with the high voltage. Therefore, in a universal setting as is described above (i.e., one that can operate with a wide range of switch voltages), it is beneficial to vary the current through the current sink circuit 600 to minimize unnecessary power dissipation, as has been described above.

Figure 7:
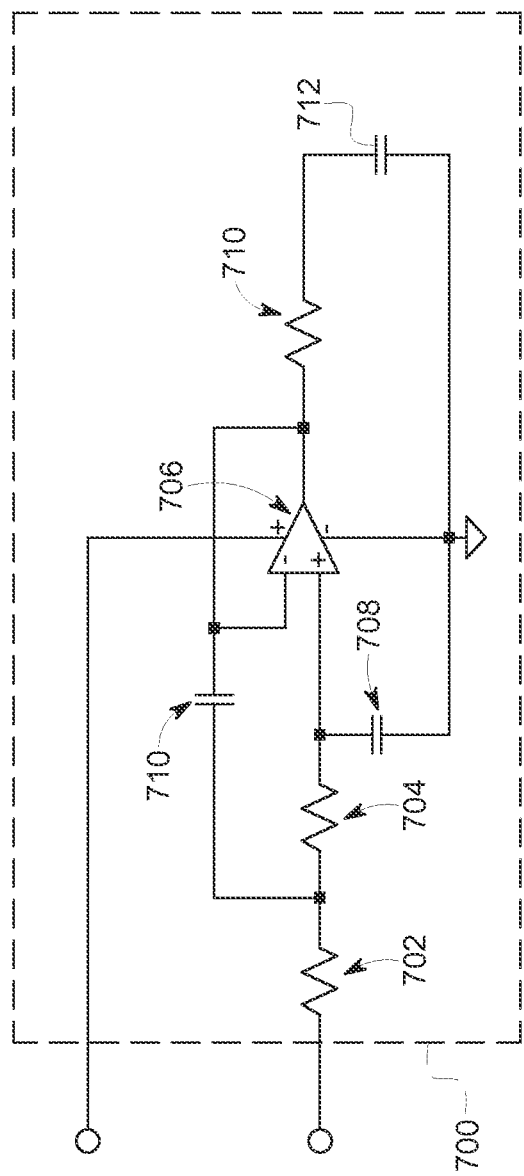
FIG. 7 comprises a circuit diagram of a portion of a contact input circuit including a low pass filter according to various embodiments of the present invention.

Referring now to FIG. 7, a low pass filter 700 connected to the output of the voltage detection portion of the contact input circuit (e.g., the contact input circuit 100) is described. FIG. 7 illustrates an example low pass filter similar to the low pass filter 610 of FIG. 6. As with the low pass filter 610 of FIG. 6, low pass filter 700 is fed a pulse train (being the pulse train output 302 representing the input voltage coming off of the output of second comparator 234, as described with respect to FIGS. 2-5 above). The low pass filter 700 receives the pulse train (e.g., the pulse train output 302 of FIG. 3) through an input resistor 702 and a second input resistor 704. This signal is fed to the non-inverting input of an op amp 706 across a filtering capacitor 708 that has its other end tied to ground. The output of the op amp 706 is fed back to the inverting input of the op amp 706 as well as through a capacitor 710 to a node between the first and second input resistors 702 and 704. The output of the op amp 706 is passed through an output resistor 710 and across an additional filter capacitor 712 to form the output of the low pass filter 700. The output of the low pass filter 700 then is a DC signal with a value that corresponds to the value of high versus low pulses in the pulse train output 302 (i.e., the average of the pulse train, for instance the pulse train output 302).

Figure 8:
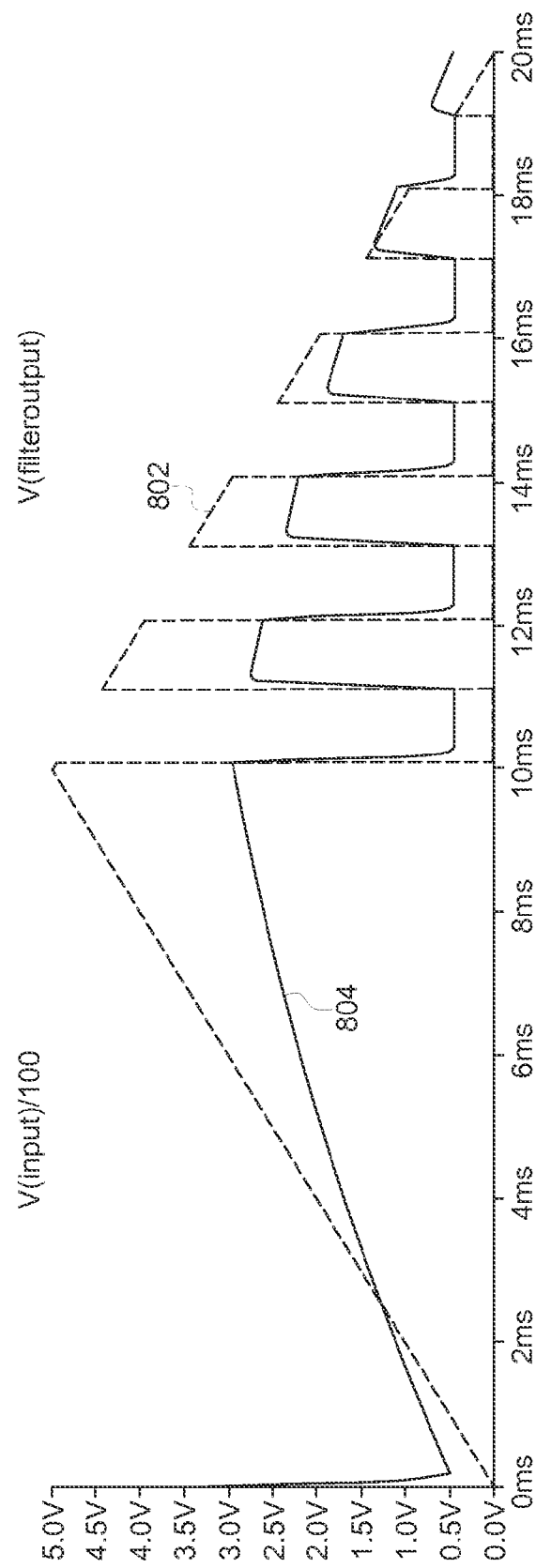
FIG. 8 comprises a voltage sweep of an input voltage according to various embodiments of the present invention.

FIG. 8 illustrates an example voltage sweep of the input voltage 802 (divided by 100 in this example) and a resulting DC voltage output from a low pass filter (e.g., output 804 of low pass filter 700). The output voltage is a scaled version of the input voltage that can traverse an isolation barrier (e.g., isolation barrier 908) as well as be within a usable voltage range by a control system.

The low pass filtered output signal can be utilized by a control system by, for example, being fed into an analog to digital converter (ADC) which will digitize the value of the DC voltage and provide it to a processing device of the control system for calculations.

Figure 9:
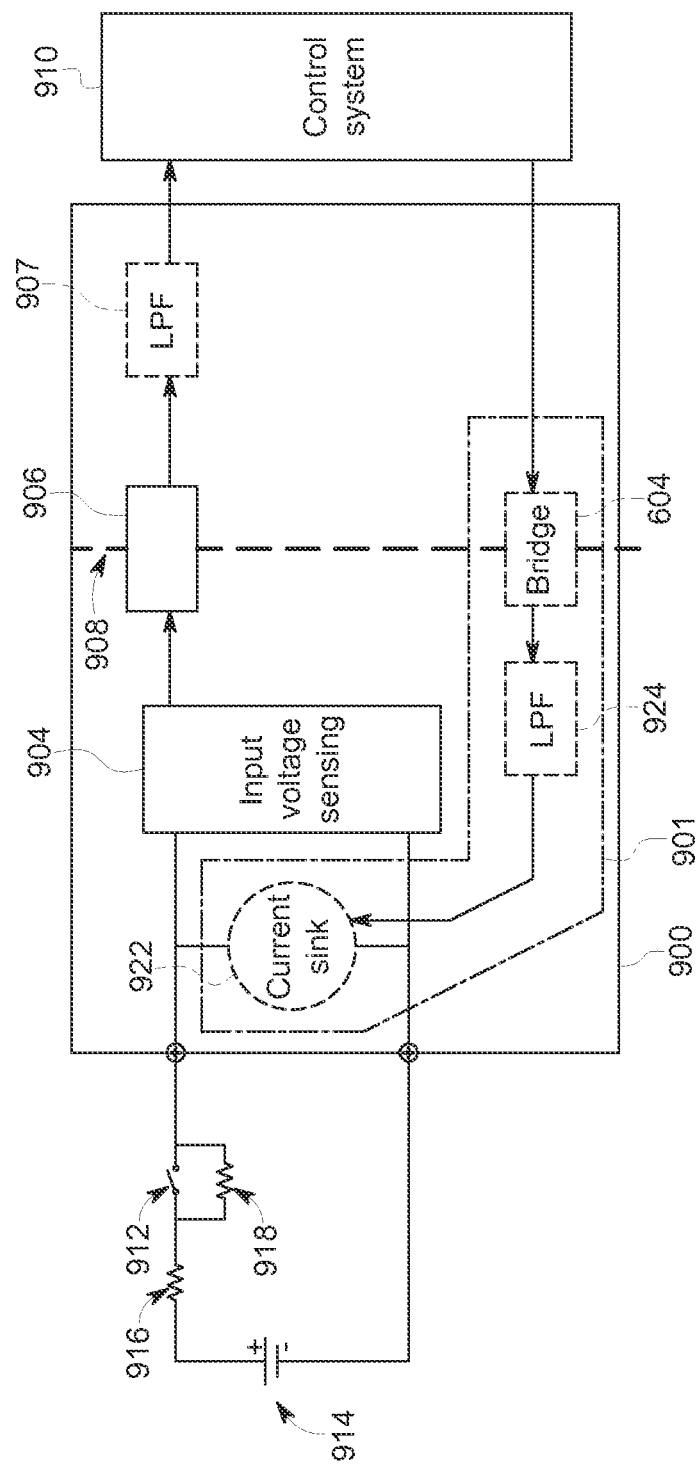
FIG. 9 comprises a block diagram is illustrated of a contact input circuit incorporating a current sink circuit and a low pass filter according to various embodiments of the present invention.

Referring now to FIG. 9, a block diagram is illustrated incorporating a current sink circuit 922 and a second low pass filter 924. Like the block diagram of FIG. 1, FIG. 9 illustrates a voltage source 914, a switching device 912 and associated resistances 916 and 918, the contact input circuit 900 including the input voltage sensing module 904 and the communications isolation module 906 (e.g., an optocoupler), as well as a control system 910 and a first low pass filter 907. Shown here is the current sink circuit 901 (including a current sink circuit 922), the second low pass filter 924, and an optocoupler 913 and associated circuitry. Also illustrated is the first low pass filter 907 inserted between the output of the input voltage sensing module 904 and the control system 910 (and as described with respect to FIGS. 7 and 8). By this alternative approach, a contact input circuit 900 is provided that is capable of producing a varying wetting current that varies commensurate with the input voltage.

It will be appreciated that the various examples described herein use various components (e.g., resistors and capacitors) that have certain values. Example values may be shown in the figures for some of these components. However, if not shown, these values will be understood or easily obtainable by those skilled in the art and, consequently, are not mentioned here.

It will be appreciated by those skilled in the art that modifications to the foregoing embodiments may be made in various aspects. Other variations clearly would also work, and are within the scope and spirit of the invention. The present invention is set forth with particularity in the appended claims. It is deemed that the spirit and scope of that invention encompasses such modifications and alterations to the embodiments herein as would be apparent to one of ordinary skill in the art and familiar with the teachings of the present application.

What is claimed is:

1. A method of creating an electrical signal that varies predictably with respect to an excitation of a switching device, the method comprising:
   receiving a voltage signal and a wetting current from a switching device;
   creating a first pulse train from the received voltage signal, the first pulse train having a first duty cycle that is proportional to the voltage signal at the switching device;
   transmitting the first pulse train across an isolation barrier;
   digitizing the first pulse train that is received across the isolation barrier to produce a digitized first pulse train and determining at least one operating condition of the switching device based upon the digitized first pulse train; and
   receiving a second pulse train having a second duty cycle and controlling the wetting current of the switching device based upon the second duty cycle.

2. The method of claim 1 wherein the second pulse train is received from a first optocoupler and the second pulse train is generated by a software controller.

3. The method of claim 1 wherein transmitting the first pulse train comprises transmitting the first pulse train using a second optocoupler.

4. The method of claim 1 wherein the at least one operating condition is a condition selected from the group consisting of: a circuitry failure, a power supply failure, a detection of an open wire, and an optocoupler failure.

5. The method of claim 1 wherein controlling the wetting current comprises filtering the second pulse train.

6. The method of claim 1 further comprising filtering the first pulse train to extract an analog signal representing the first duty cycle and analyzing the analog signal.

7. The method of claim 1 wherein creating a first pulse train from the voltage signal comprises creating a first pulse train from the voltage signal regardless of a value of the voltage signal.

8. The method of claim 1 wherein the method is implemented on an application specific integrated circuit (ASIC).

9. The method of claim 1 wherein the switching device comprises a contact.

10. An apparatus that is configured to create an electrical signal that varies predictably with respect to a switch excitation, the apparatus comprising:
   an input voltage sensing circuit, the input voltage sensing circuit configured to receive a voltage signal and a wetting current from a switching device and responsively create a first pulse train from the received voltage signal, the first pulse train having a first duty cycle that is proportional to the voltage signal at the switching device;
   a communications isolation circuit that is coupled to the input voltage sensing circuit and configured to transmit the first pulse train across an isolation barrier;
   wherein the communications isolation circuit configured to digitize the first pulse train that is received across the isolation barrier to produce a digitized first pulse train and wherein at least one operating condition of the switching device is determinable based upon the digitized first pulse train; and
   a current sink circuit coupled to switching device and the input sensing circuit, the current sink circuit being configured to receive a second pulse train having a second duty cycle and control the wetting current based upon the second duty cycle.

11. The apparatus of claim 10 wherein the second pulse train is received from a first optocoupler and the second pulse train is generated by a software controller.

12. The apparatus of claim 10 wherein the communications isolation circuit comprises a second optocoupler.

13. The apparatus of claim 10 wherein the at least one operating condition is a condition selected from the group consisting of: a circuitry failure, a power supply failure, a detection of an open wire, and an optocoupler failure.

14. The apparatus of claim 10 further comprising a first filter that is configured to filter the second pulse train.

15. The apparatus of claim 10 further comprising a second filter, the second filter configured to filter the first pulse train to extract an analog signal representing the first duty cycle.

16. The apparatus of claim 10 wherein the first pulse train is created from the voltage signal regardless of a value of the voltage signal.

17. The apparatus of claim 10 wherein the apparatus is disposed on an integrated circuit.

18. The apparatus of claim 17 wherein the integrated circuit is an application specific integrated circuit (ASIC).

19. The apparatus of claim 10 wherein the switching device comprises a contact.

\* \* \* \* \*